(12) United States Patent
Koniaris et al.

(10) Patent No.: US 7,782,110 B1
(45) Date of Patent: Aug. 24, 2010

(54) SYSTEMS AND METHODS FOR INTEGRATED CIRCUITS COMPRISING MULTIPLE BODY BIAS DOMAINS

(76) Inventors: Kleanthes G. Koniaris, 861 University Ave., #10, Palo Alto, CA (US) 94301; James B. Burr, 511 Broughton La., Foster City, CA (US) 94404

( * ) Notice: Subject to any disclaimer, the term of this patent is extended or adjusted under 35 U.S.C. 154(b) by 610 days.

(21) Appl. No.: 11/880,351

(22) Filed: Jul. 19, 2007

Related U.S. Application Data

(60) Division of application No. 10/956,218, filed on Sep. 30, 2004, now Pat. No. 7,256,639, which is a continuation-in-part of application No. 10/771,015, filed on Feb. 2, 2004, now Pat. No. 7,205,758.

(51) Int. Cl.
*G06F 1/14* (2006.01)
*H03K 3/017* (2006.01)

(52) U.S. Cl. .................... 327/291; 327/534
(58) Field of Classification Search .............. 327/291, 327/534
See application file for complete search history.

(56) References Cited

U.S. PATENT DOCUMENTS

| | | | |
|---|---|---|---|
| 5,086,501 A | 2/1992 | DeLuca et al. | |
| 5,096,084 A | 3/1992 | Wells | |
| 5,167,024 A | 11/1992 | Smith et al. | |
| 5,201,059 A | 4/1993 | Nguyen | |
| 5,204,863 A | 4/1993 | Saint-Joigny et al. | |
| 5,218,704 A | 6/1993 | Watts, Jr. et al. | |
| 5,230,055 A | 7/1993 | Katz et al. | |
| 5,239,652 A | 8/1993 | Seibert et al. | |
| 5,243,559 A | 9/1993 | Murai | |
| 5,422,591 A | 6/1995 | Rastegar et al. | |
| 5,422,806 A | 6/1995 | Chen et al. | |
| 5,440,520 A | 8/1995 | Schutz et al. | |
| 5,461,266 A | 10/1995 | Koreeda et al. | |
| 5,502,838 A | 3/1996 | Kikinis | |
| 5,511,203 A | 4/1996 | Wisor et al. | |
| 5,519,309 A | 5/1996 | Smith | |
| 5,560,020 A | 9/1996 | Nakatani et al. | |
| 5,592,173 A | 1/1997 | Lau et al. | |
| 5,610,533 A | 3/1997 | Arimoto et al. | |

(Continued)

FOREIGN PATENT DOCUMENTS

EP  0381021  8/1990

(Continued)

OTHER PUBLICATIONS

Advisory Action Dated Feb. 19, 2010; U.S. Appl. No. 10/956,722.

(Continued)

*Primary Examiner*—Evan Pert

(57) ABSTRACT

Systems and methods for integrated circuits comprising multiple body bias domains. In accordance with a first embodiment of the present invention, an integrated circuit is constructed comprising active semiconductor devices in first and second body bias domains. A first body biasing voltage is coupled to the first body bias domain, and a second body biasing voltage is coupled to the second body bias domain. The first and the second body biasing voltages are adjusted to achieve a desirable relative performance between the active semiconductor devices in the first and the second body bias domains.

10 Claims, 6 Drawing Sheets

U.S. PATENT DOCUMENTS

| | | | |
|---|---|---|---|
| 5,682,093 A | 10/1997 | Kivela | |
| 5,692,204 A | 11/1997 | Rawson et al. | |
| 5,717,319 A | 2/1998 | Jokinen | |
| 5,719,800 A | 2/1998 | Mittal et al. | |
| 5,727,208 A | 3/1998 | Brown | |
| 5,745,375 A | 4/1998 | Reinhardt et al. | |
| 5,752,011 A | 5/1998 | Thomas et al. | |
| 5,754,869 A | 5/1998 | Holzhammer et al. | |
| 5,757,171 A | 5/1998 | Babcock | |
| 5,778,237 A | 7/1998 | Yamamoto et al. | |
| 5,812,860 A | 9/1998 | Horden et al. | |
| 5,815,724 A | 9/1998 | Mates | |
| 5,825,674 A | 10/1998 | Jackson | |
| 5,848,281 A | 12/1998 | Smalley et al. | |
| 5,880,620 A | 3/1999 | Gitlin et al. | |
| 5,884,049 A | 3/1999 | Atkinson | |
| 5,894,577 A | 4/1999 | MacDonald et al. | |
| 5,923,545 A | 7/1999 | Nguyen | |
| 5,933,649 A | 8/1999 | Lim et al. | |
| 5,940,785 A | 8/1999 | Georgiou et al. | |
| 5,940,786 A | 8/1999 | Steeby | |
| 5,973,526 A | 10/1999 | Dabral | |
| 5,974,557 A | 10/1999 | Thomas et al. | |
| 5,996,083 A | 11/1999 | Gupta et al. | |
| 5,996,084 A | 11/1999 | Watts | |
| 6,023,186 A | 2/2000 | Kuroda | |
| 6,035,407 A | 3/2000 | Gebara et al. | |
| 6,047,248 A | 4/2000 | Georgiou et al. | |
| 6,048,746 A | 4/2000 | Burr | |
| 6,055,644 A | 4/2000 | Henkel | |
| 6,055,655 A | 4/2000 | Momohara | |
| 6,078,319 A | 6/2000 | Bril et al. | |
| 6,087,892 A | 7/2000 | Burr | |
| 6,091,283 A | 7/2000 | Murgula et al. | |
| 6,097,242 A | 8/2000 | Forbes et al. | |
| 6,118,306 A | 9/2000 | Orton et al. | |
| 6,119,241 A | 9/2000 | Michail et al. | |
| 6,157,092 A | 12/2000 | Hofmann | |
| 6,202,104 B1 | 3/2001 | Ober | |
| 6,216,235 B1 | 4/2001 | Thomas et al. | |
| 6,218,708 B1 | 4/2001 | Burr | |
| 6,218,892 B1 | 4/2001 | Soumyanath et al. | |
| 6,218,895 B1 | 4/2001 | De et al. | |
| 6,232,793 B1 | 5/2001 | Arimoto et al. | |
| 6,232,827 B1 | 5/2001 | De et al. | |
| 6,272,642 B2 | 8/2001 | Pole, II et al. | |
| 6,272,666 B1 | 8/2001 | Borkar et al. | |
| 6,279,048 B1 | 8/2001 | Fadavi-Ardekani et al. | |
| 6,303,444 B1 | 10/2001 | Burr | |
| 6,304,824 B1 | 10/2001 | Bausch et al. | |
| 6,311,287 B1 | 10/2001 | Dischler et al. | |
| 6,314,522 B1 | 11/2001 | Chu et al. | |
| 6,333,571 B1 | 12/2001 | Teraoka et al. | |
| 6,341,087 B1 | 1/2002 | Kunikiyo | |
| 6,345,363 B1 | 2/2002 | Levy-Kendler | |
| 6,347,379 B1 | 2/2002 | Dai et al. | |
| 6,378,081 B1 | 4/2002 | Hammond | |
| 6,388,432 B2 | 5/2002 | Uchida | |
| 6,392,467 B1 | 5/2002 | Oowaki et al. | |
| 6,411,156 B1 | 6/2002 | Borkar et al. | |
| 6,415,388 B1 | 7/2002 | Browning et al. | |
| 6,425,086 B1 | 7/2002 | Clark et al. | |
| 6,427,211 B2 | 7/2002 | Watts, Jr. | |
| 6,442,746 B1 | 8/2002 | James et al. | |
| 6,456,157 B1 | 9/2002 | Forbes et al. | |
| 6,457,135 B1 | 9/2002 | Cooper | |
| 6,466,077 B1 | 10/2002 | Miyazaki et al. | |
| 6,477,654 B1 | 11/2002 | Dean et al. | |
| 6,484,265 B2 | 11/2002 | Borkar et al. | |
| 6,487,668 B2 | 11/2002 | Thomas et al. | |
| 6,489,224 B1 | 12/2002 | Burr | |
| 6,510,400 B1 | 1/2003 | Moriyama | |
| 6,510,525 B1 | 1/2003 | Nookala et al. | |
| 6,513,124 B1 | 1/2003 | Furuichi et al. | |
| 6,518,826 B2 | 2/2003 | Zhang | |
| 6,519,706 B1 | 2/2003 | Ogoro | |
| 6,574,739 B1 | 6/2003 | Kung et al. | |
| 6,600,346 B1 | 7/2003 | Macaluso | |
| 6,614,301 B2 | 9/2003 | Casper et al. | |
| 6,621,325 B2 | 9/2003 | Hart et al. | |
| 6,653,890 B2 | 11/2003 | Ono et al. | |
| 6,731,157 B2 | 5/2004 | Fulkerson | |
| 6,777,978 B2 | 8/2004 | Hart et al. | |
| 6,784,722 B2 | 8/2004 | Tang et al. | |
| 6,792,379 B2 | 9/2004 | Ando | |
| 6,794,630 B2 | 9/2004 | Keshavarzi et al. | |
| 6,812,758 B2 | 11/2004 | Gauthier et al. | |
| 6,847,252 B1 | 1/2005 | Ono et al. | |
| 6,858,897 B2 | 2/2005 | Chen | |
| 6,864,539 B2 | 3/2005 | Ishibashi et al. | |
| 6,912,155 B2 | 6/2005 | Sakurai et al. | |
| 6,936,898 B2 | 8/2005 | Pelham et al. | |
| 6,967,522 B2 | 11/2005 | Chandrakasan et al. | |
| 6,992,508 B2 | 1/2006 | Chow | |
| 7,129,745 B2 | 10/2006 | Lewis et al. | |
| 7,205,758 B1 | 4/2007 | Masleid et al. | |
| 7,334,198 B2 | 2/2008 | Ditzel et al. | |
| 7,348,827 B2 | 3/2008 | Rahim et al. | |
| 2002/0002689 A1 | 1/2002 | Yeh | |
| 2002/0026597 A1 | 2/2002 | Dai et al. | |
| 2002/0029352 A1 | 3/2002 | Borkar et al. | |
| 2002/0030533 A1 | 3/2002 | De et al. | |
| 2002/0033510 A1 | 3/2002 | Tomita | |
| 2002/0073348 A1 | 6/2002 | Tani | |
| 2002/0083356 A1 | 6/2002 | Dai | |
| 2002/0087896 A1 | 7/2002 | Cline et al. | |
| 2002/0113628 A1 | 8/2002 | Ajit | |
| 2002/0116650 A1 | 8/2002 | Halepete et al. | |
| 2002/0138778 A1 | 9/2002 | Cole et al. | |
| 2002/0140494 A1 | 10/2002 | Thomas et al. | |
| 2002/0178390 A1 | 11/2002 | Lee | |
| 2002/0194509 A1 | 12/2002 | Plante et al. | |
| 2003/0005378 A1 | 1/2003 | Tschanz et al. | |
| 2003/0021161 A1 | 1/2003 | Fifield et al. | |
| 2003/0036876 A1 | 2/2003 | Fuller, III et al. | |
| 2003/0037068 A1 | 2/2003 | Thomas et al. | |
| 2003/0063513 A1 | 4/2003 | Tsunoda et al. | |
| 2003/0065960 A1 | 4/2003 | Rusu et al. | |
| 2003/0074591 A1 | 4/2003 | McClendon et al. | |
| 2003/0080802 A1 | 5/2003 | Ono et al. | |
| 2003/0132735 A1 | 7/2003 | Fulkerson | |
| 2003/0149988 A1 | 8/2003 | Ellis et al. | |
| 2004/0014268 A1 | 1/2004 | Ishibashi et al. | |
| 2004/0016977 A1 | 1/2004 | Miyazaki et al. | |
| 2004/0021501 A1 | 2/2004 | Das et al. | |
| 2004/0025061 A1 | 2/2004 | Lawrence | |
| 2004/0073821 A1 | 4/2004 | Naveh et al. | |
| 2004/0109354 A1 | 6/2004 | Wang et al. | |
| 2004/0123170 A1 | 6/2004 | Tschanz et al. | |
| 2004/0125644 A1 | 7/2004 | Komatsuzaki | |
| 2004/0128631 A1 | 7/2004 | Ditzel et al. | |
| 2004/0155696 A1 | 8/2004 | Gauthier et al. | |
| 2004/0217372 A1 | 11/2004 | Chen | |
| 2005/0160465 A1 | 7/2005 | Walker | |
| 2005/0225376 A1 | 10/2005 | Kin Law | |
| 2005/0237083 A1 | 10/2005 | Bakker et al. | |
| 2005/0280437 A1 | 12/2005 | Lewis et al. | |
| 2006/0157815 A1 | 7/2006 | Chang et al. | |
| 2006/0157818 A1 | 7/2006 | Williams et al. | |
| 2006/0223257 A1 | 10/2006 | Williams et al. | |

FOREIGN PATENT DOCUMENTS

| | | |
|---|---|---|
| EP | 0474963 | 3/1992 |

| | | |
|---|---|---|
| EP | 0501655 | 9/1992 |
| JP | 40915589 | 7/1997 |
| WO | 0127728 | 4/2001 |

OTHER PUBLICATIONS

Non-Final Office Action Dated Mar. 16, 2010; U.S. Appl. No. 10/956,722.
Final Office Action Dated Mar. 16, 2010; U.S. Appl. No. 11/400,368.
"High-Speed, Digitally Adjusted Stepdown Controllers for Notebook CPUS", Maxim Manual, pp. 11 & 12.
"Wafer Burn-In Isolation Circuit"; IBM Technical Disclosure Bulletin; IBM Corp, New York, US, vol. 32, No. 6B, Nov. 1, 1989, pp. 442-443; XP00073858 ISSN: 0018-8689 (The Whole Document).
Baker, K., et al,; "SHMOO Plotting: The Black Art of IC Testing"; IEEE Design & Test of Computers, IEEE vol. 14, No. 3; Jul. 1, 1997, pp. 90-97, XP000793305 ISSN: 0740-7475 the whole documents.
Computer Software, Wikipedia; "http://en.wikipedia.org/wiki/Software"; retrieved on May 2, 2007.
Desai, et al,; "Sizing of Clock Distribution Networks for High Performance CPU Chips"; Digital Equipment Corporation, Hudson, MA, pp. 389-394, 1996.
Linear Technology, LTC 1736 5-BIT Adjustable High Efficiency Synchronous Step-Down Switching Regulator; p. 1-28; Linear Technology Corporation 1999.
Notice of Allowance dated Apr. 4, 2007; U.S. Appl. No. 10/956,218.
Notice of Allowance dated Nov. 21, 2006; U.S. Appl. No. 10/956,218.
Restriction Requirement Dated Jan. 12, 2006; U.S. Appl. No. 10/956,218.
Final OA Dated Jun. 23, 2006; U.S. Appl. No. 10/771,015.
Non Final OA Dated Jan. 10, 2006; U.S. Appl. No. 10/771,015.
Non Final OA Dated Jul. 29, 2005; U.S. Appl. No. 10/771,015.
Restriction Requirement Dated May 4, 2005; U.S. Appl. No. 10/771,015.
Final OA Dated Jul. 26, 2007; U.S. Appl. No. 10/956,722.
Non Final OA Dated Apr. 14, 2009; U.S. Appl. No. 10/956,722.
Non Final OA Dated May 17, 2006; U.S. Appl. No. 10/956,722.
Non Final OA Dated Jun. 12, 2008; U.S. Appl. No. 10/956,722.
Non Final OA Dated Nov. 16, 2006; U.S. Appl. No. 10/956,722.
Non Final OA Dated Dec. 12, 2007; U.S. Appl. No. 10/956,722.
Non Final OA Dated Dec. 23, 2008; U.S. Appl. No. 10/956,722.
Restriction Requirement Dated Dec. 2, 2005; U.S. Appl. No. 10/956,722.
*Ex Parte Quayle* Dated May 7, 2008; U.S. Appl. No. 11/787,908.
Notice of Allowance Dated Jan. 5, 2009; U.S. Appl. No. 11/787,908.
Notice of Allowance Dated Sep. 9, 2008; U.S. Appl. No. 11/787,908.
Restriction Requirement Dated Jan. 16, 2008; U.S. Appl. No. 11/787,908.
Non Final OA Dated May 17, 2006; U.S. Appl. No. 10/956,218.
Notice of Allowance Dated Dec. 6, 2006; U.S. Appl. No. 10/771,015.
Non Final OA Dated Oct. 7, 2008; U.S. Appl. No. 11/400,368.
Non Final OA Dated Apr. 3, 2009; U.S. Appl. No. 11/400,368.
Notice of Allowance Dated May 4, 2009; U.S. Appl. No. 11/787,908.
Linear Technology, LTC 1736 5-Bit Adjustable High Efficiency Synchronous Step-Down Switching Regulator; p. 1-28; Linear Technology Corporation 1999.
Restriction Requirement; Mail Date Oct. 14, 2009; U.S. Appl. No. 11/400,368.
Final Office Action; Mail Date Dec. 8, 2009; U.S. Appl. No. 10/956,722.

US 7,782,110 B1

SYSTEMS AND METHODS FOR INTEGRATED CIRCUITS COMPRISING MULTIPLE BODY BIAS DOMAINS

RELATED APPLICATIONS

This Application is a Divisional Application of U.S. patent application Ser. No. 10/956,218, filed Sep. 30, 2004 now U.S. Pat. No. 7,256,639, to Koniaris and Burr, which is a continuation-in-part of commonly owned U.S. patent application Ser. No. 10/771,015, filed Feb. 2, 2004 now U.S. Pat. No. 7,205,758, entitled "Systems and Methods for Adjusting Threshold Voltage" to Masleid and Burr. Both prior applications are hereby incorporated herein by reference in their entirety.

This Application is related to co-pending, commonly owned U.S. patent application Ser. No. 10/956,722 filed Sep. 30, 2004, entitled "Systems and Methods for Integrated Circuits comprising Multiple Body Bias Domains" to Koniaris et al., which is hereby incorporated herein by reference in its entirety.

FIELD OF THE INVENTION

Embodiments in accordance with the present invention relate to systems and methods for integrated circuits comprising multiple body bias domains.

BACKGROUND

It is desirable to adjust or change operating characteristics, for example, maximum frequency of operation, leakage current, slew rate and the like, of transistors and more complex circuits of an integrated circuit after the integrated circuit has been produced.

SUMMARY OF THE INVENTION

Therefore, systems and methods for integrated circuits comprising multiple body bias domains would be highly desirable.

Accordingly, systems and methods for integrated circuits comprising multiple body bias domains are disclosed. In accordance with a first embodiment of the present invention, an integrated circuit is constructed comprising active semiconductor devices in first and second body bias domains. A first body biasing voltage is coupled to the first body bias domain, and a second body biasing voltage is coupled to the second body bias domain. The first and the second body biasing voltages are adjusted to achieve a desirable relative performance between the active semiconductor devices in the first and the second body bias domains.

In accordance with another embodiment of the present invention, a body bias voltage is adjusted to adjust a slew rate of an output cell of an integrated circuit.

In accordance with yet another embodiment of the present invention, a tap granularity of a delay locked loop circuit is adjusted by adjusting a body bias voltage of the delay locked loop circuit.

DETAILED DESCRIPTION OF THE INVENTION

Figure 1:
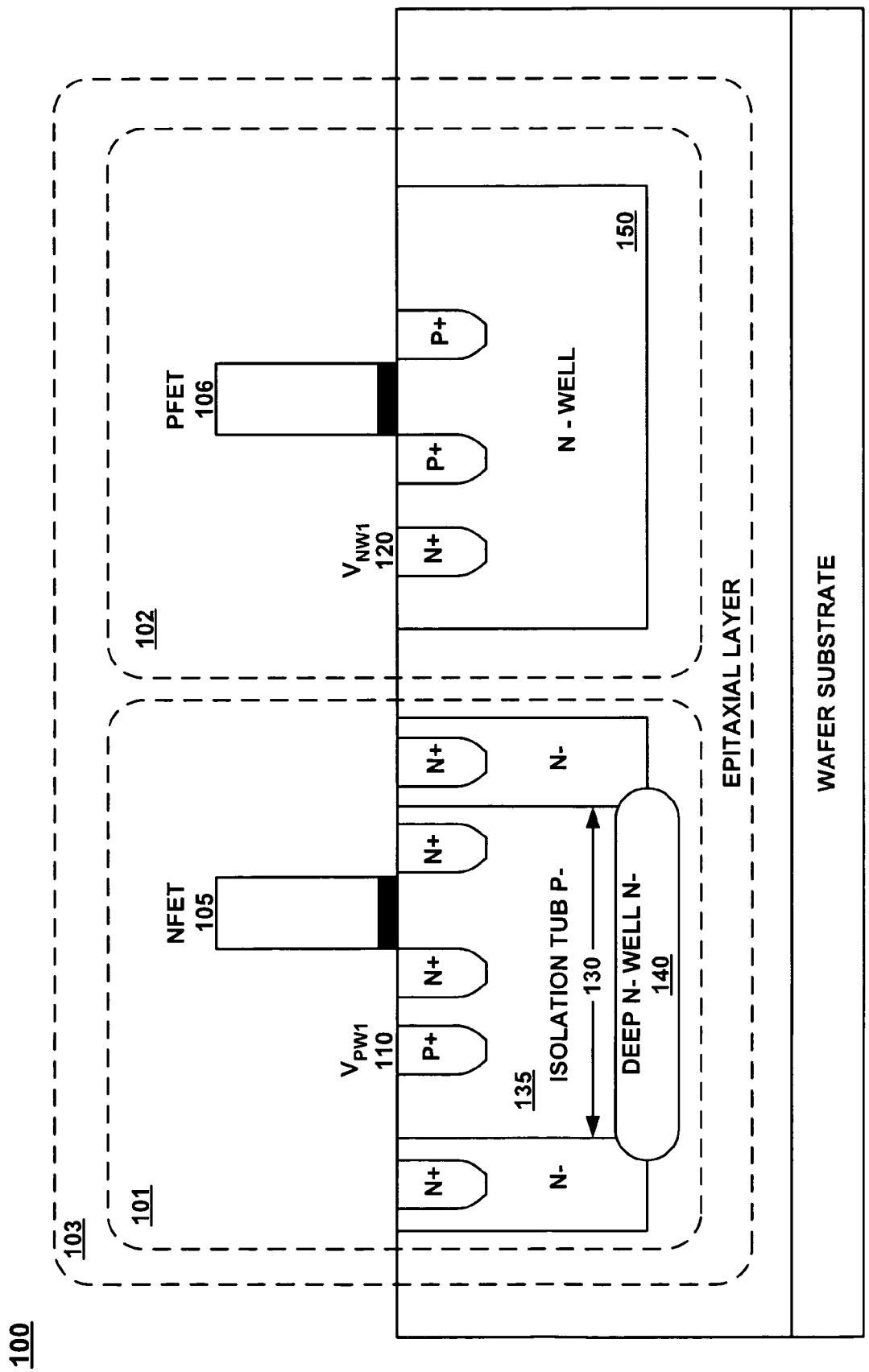
FIG. 1 illustrates a side sectional view of a portion of an integrated circuit, in accordance with embodiments of the present invention.

In the following detailed description of the present invention, systems and methods for integrated circuits comprising multiple body bias domains, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow (e.g., processes 400, 500 and 600) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing" or "dividing" or "computing" or "testing" or "calculating" or "determining" or "storing" or "measuring" or "adjusting" or "generating" or "performing" or "comparing" or "synchronizing" or "accessing" or "retrieving" or "conveying" or "sending" or "resuming" or "installing" or "gathering" or the like, refer to the action and processes of a computer system, or similar electronic computing device that manipulates and transforms data represented as physical (electronic) quantities within the computer system's registers and memories into other data similarly represented as physical quantities within the computer system memories or registers or other such information storage, transmission or display devices.

Systems and Methods for Integrated Circuits Comprising Multiple Body Bias Domains Embodiments in accordance with the present invention are described in the context of design and operation of integrated semiconductors. More particularly, embodiments of the present invention relate to systems and methods for integrated circuits comprising multiple body bias domains. It is appreciated, however, that elements of the present invention may be utilized in other areas of semiconductor operation.

The following description of embodiments in accordance with the present invention is directed toward coupling a body-bias voltage to pFETs (or p-type metal oxide semiconductor field effect transistors [MOSFETS]) formed in surface N-wells and/or nFETs (or n-type MOSFETS) formed in surface P-wells when a p-type substrate and an N-well process are utilized. For example, the coupling can comprise a conductive sub-surface region of N-type doping, e.g., a deep N-well. It is to be appreciated, however, that embodiments in accordance with the present invention are equally applicable to coupling a body-bias voltage to nFETs (or n-type MOSFETS) formed in surface P-wells and/or pFETs (or p-type MOSFETS) formed in surface N-wells when an n-type substrate and a P-well process are utilized, e.g., comprising a conductive sub-surface region of P-type doping, e.g., a deep P-well. Consequently, embodiments in accordance with the present invention are well suited to semiconductors formed in both p-type and n-type materials, and such embodiments are considered within the scope of the present invention.

FIG. 1 illustrates a side sectional view of a portion of an integrated circuit 100, in accordance with embodiments of the present invention. Integrated circuit 100 comprises a body bias domain 101. Body bias domain 101 comprises n-type field effect transistor 105. It is to be appreciated that a body bias domain may generally comprise more than the single transistor illustrated in FIG. 1. A body bias domain can comprise many transistors, for example, a complete functional circuit or logical sub-unit of a microprocessor, e.g., an arithmetic logic unit (ALU) or a memory controller.

Body bias domain 101 comprises an isolation tub 135 such that the body terminals of field effect transistors, e.g., field effect transistor 105, within such body bias domains are not directly coupled to the substrate of integrated circuit 100. The isolation tub 135 is formed by n-wells 130 on the sides and a deep n-well layer 140 on the bottom. It is appreciated that the sidewall n-well 130 structures extend beyond the plane of FIG. 1 forming a closed figure in plan view.

A body biasing voltage 110 Vpw1 is coupled to the body terminals of transistors within body bias domain 101, e.g., field effect transistor 105. By adjusting a body biasing voltage of a transistor, e.g., body biasing voltage 110 Vpw1, the threshold voltage of that transistor can be adjusted, e.g., increased or decreased, relative to the nominal threshold voltage of that transistor without an applied body biasing voltage.

In a similar fashion, integrated circuit 100 comprises a body bias domain 102. Body bias domain 102 comprises p-type field effect transistor 106. It is to be appreciated that a body bias domain may generally comprise more than the single transistor illustrated in FIG. 1. A body bias domain can comprise many transistors, for example, a complete functional circuit. Body bias domain 102 comprises a surface n-well 150 such that the body terminals of field effect transistors, e.g., field effect transistor 106, within such body bias domains are not directly coupled to the substrate of integrated circuit 100.

A body biasing voltage 120 Vnw1 is coupled to the body terminals of transistors within body bias domain 102, e.g., field effect transistor 106. By adjusting a body biasing voltage of a transistor, e.g., body biasing voltage 120 Vnw1, the threshold voltage of that transistor can be adjusted, e.g., increased or decreased, relative to the nominal threshold voltage of that transistor without an applied body biasing voltage.

It is to be appreciated that embodiments in accordance with the present invention are not limited to the structures illustrated herein for isolating body terminals and applying body biasing voltages to such body terminals. Rather, embodiments in accordance with the present invention are well suited to a wide variety of means to couple to and isolate transistor body terminals in an integrated circuit.

Because integrated circuits typically comprise both n-type and p-type devices, e.g., complimentary metal oxide semiconductors (CMOS), the term "body bias domain" may also be used to represent or refer to a group of n-type devices and p-type devices sharing one body biasing voltage or a pair of body biasing voltages, referred to as a "set" of body biasing voltages. The set of body biasing voltages will generally be utilized in tandem to adjust operating characteristics of the group of devices as a whole. For example, generally a set of body biasing voltages will be adjusted to achieve similar adjustments to operating characteristics of both n-type and p-type devices, e.g., increase threshold voltages of both n-type and p-type devices. However, it is to be appreciated that it may be desirable to perform different adjustments of p-type device and n-type devices within a body bias domain. For example, it may be desirable to increase the threshold voltage of n-type devices while decreasing the threshold voltage of p-type devices. Similarly, it may be desirable to decrease the threshold voltage of n-type devices and not adjust the threshold voltage of p-type devices. All such paired adjustments are considered within the scope of embodiments of the present invention.

Such adjustments of threshold voltage generally result in changes to other characteristics of a transistor, for example, maximum frequency of operation, leakage current and/or power consumption. It is to be appreciated that such changes to transistor characteristics can be realized without changes to the physical structure of the transistor. More particularly, such changes to transistor characteristics can be realized in a time-variable nature after an integrated circuit has been produced. For example, a transistor within a body bias domain can be operated at a first set of characteristics corresponding to a first applied body biasing voltage at one time, and the same transistor can be operated at a second set of characteristics corresponding to a second applied body biasing voltage at a second time.

Slew Rate Control

Slew rate control is an area of great interest in the semiconductor arts. For example, it is desirable to control the slew rate of off-chip driver circuits, e.g., output cells that drive signals off of an integrated circuit, in order to reduce radiated electro-magnetic emissions. However, such off-chip driver circuits should still meet a minimum slew rate required for timing and/or trigging conditions of the driven circuitry. Such slew rate requirements are strongly influenced by a variety of considerations specific to a particular application of an integrated circuit, e.g., the circuitry being driven and/or the physical layout of a variety of integrated circuits on a printed wiring board. Consequently, a desirable slew rate can vary for a given integrated circuit, e.g., a microprocessor, by application.

In addition, a desirable slew rate can vary even for the same integrated circuit in the same application. For example, a desirable slew rate, or range of slew rates, for an off-chip driver circuit of a microprocessor can vary according to the operating frequency of the microprocessor. As it is frequently desirable to operate microprocessors at a variety of operating frequencies, e.g., to limit power consumption, such desirable slew rates can vary according to desired operating frequencies of the microprocessor. Consequently, it would be highly advantageous to be able to adjust the slew rate of a portion of an integrated circuit after the integrated circuit has been manufactured, e.g., on a per-application basis and/or during operation of the integrated circuit.

In accordance with embodiments of the present invention, an applied body bias voltage can be adjusted to adjust and/or control the slew rate of a transistor device on an integrated circuit. For example, referring once again to FIG. 1, by adjusting body biasing voltage 110 Vpw1 to field effect transistor 105, the slew rate of field effect transistor 105 can be adjusted to a desired value.

Integrated circuit 100 generally comprises circuitry (not shown) that is not a part of the illustrated body bias domain 103. Such circuitry may be part of a separate body bias domain, or such circuitry may not comprise a body biasing capability. Since body bias domain 103 is isolated from such other circuitry, the other circuitry can be operated independently of characteristic changes to circuitry within body bias domain 103. For example, the operating characteristics of transistors comprising other logic on integrated circuit 100 will generally not be affected by changes to the operating characteristics of field effect transistor 105 and/or field effect transistor 106. Consequently, operating characteristics of field effect transistor 105 and/or field effect transistor 106 can beneficially be manipulated without detrimental impact to other devices on the integrated circuit.

Figure 4:
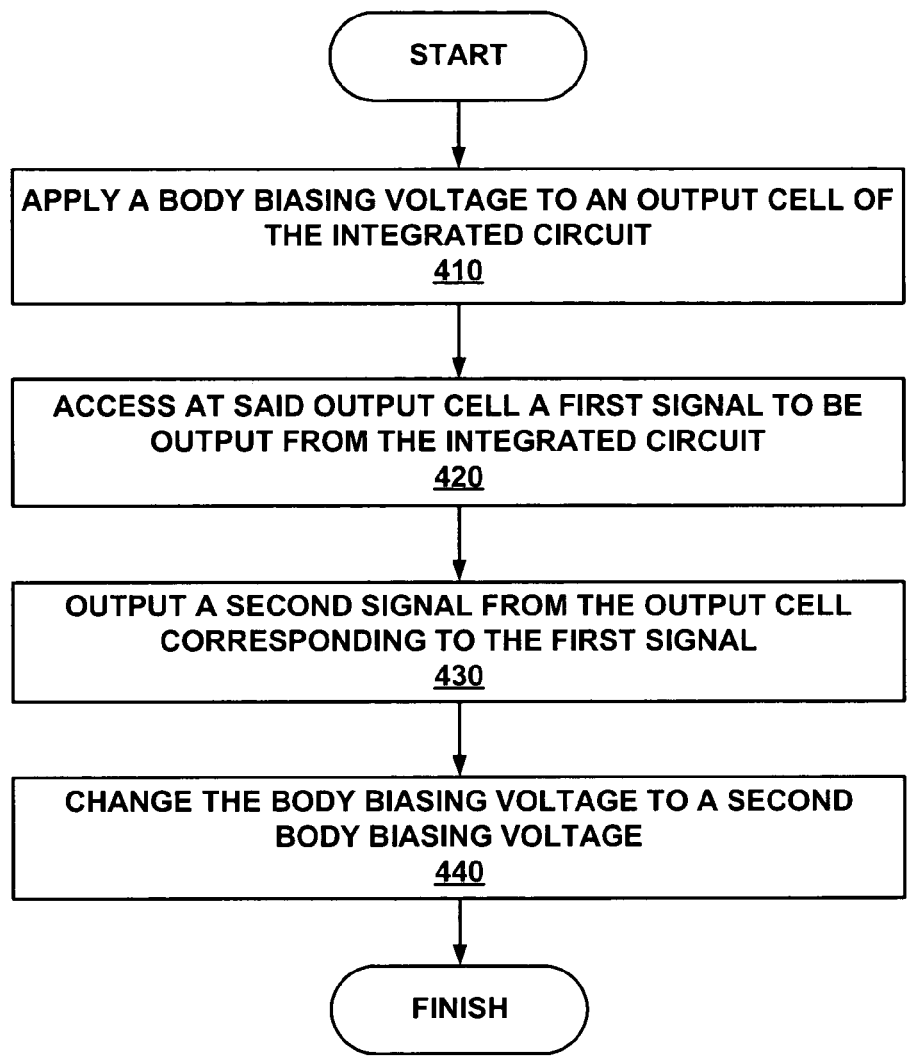
FIG. 4 illustrates a flowchart of a method of operating an integrated circuit, in accordance with embodiments of the present invention.

FIG. 4 illustrates a flowchart of a method 400 of operating an integrated circuit, in accordance with embodiments of the present invention. In block 410, a body biasing voltage is applied to an output cell of the integrated circuit.

In block 420, a first signal to be output from the integrated circuit is accessed at the output cell. In block 430, a second signal corresponding to the first signal is output from the output cell. In optional block 440, the body biasing voltage is changed to a second body biasing voltage.

In accordance with embodiments of the present invention, the second signal, output from the output cell, can comprise a desirable slew rate. The output slew rate can be less than a slew rate generated by the output cell without the body biasing voltage applied.

In accordance with other embodiments of the present invention, the body biasing voltage can be changed to a second body biasing voltage, for example, to change the slew rate of the output signal. The slew rate can be increased or decreased. For example, in a microprocessor comprising the output cell, the slew rate should generally be increased corresponding to increases in operating frequency of the microprocessor.

Delay Locked Loops

Synchronous integrated circuit designs, e.g., microprocessors, generally rely on globally synchronized clocks. With increases in clock rates, low-skew clock distribution trees are becoming increasingly critical to achieving design speed objectives. High-speed circuits may also require clocks with programmable duty cycle and delay. Delay-locked loop (DLL) circuits are widely used for such clock management purposes.

Delay-locked loop (DLL) circuits generally comprise a plurality of "taps," or circuit outputs that can be utilized to achieve varying amounts of delay. For example, accessing an output at a first tap produces a delay of a one unit, while accessing an output at a second tap produces a delay of two units. It is appreciated that the time relationship between taps need not be linear. Frequently, it would be desirable to increase the range of available delay(s) and/or to increase the granularity of delay increments available in a specific delay locked loop within an integrated circuit. A conventional approach to increase such characteristics is to increase the number of taps in the delay locked loop design, e.g., a change to the design of the delay locked loop circuit. However, increases in the number of taps generally require corresponding increases in integrated circuit area that undesirably increase the cost of an integrated circuit. Further, even with a large number of taps, the delay range and granularity remain finite.

In accordance with embodiments of the present invention, applied body bias voltage(s) can be adjusted to adjust and/or control the delay range and/or delay granularity of a delay locked loop. For example, a delay locked loop circuit can be constructed within a body bias domain, such that changes to body biasing voltage(s) affect all elements (or all like-typed elements) of the delay locked loop. By utilizing such a design, the delay locked loop circuit can be made to operate faster or slower by adjusting body biasing voltage(s) applied to the body bias domain comprising the delay locked loop.

Figure 2:
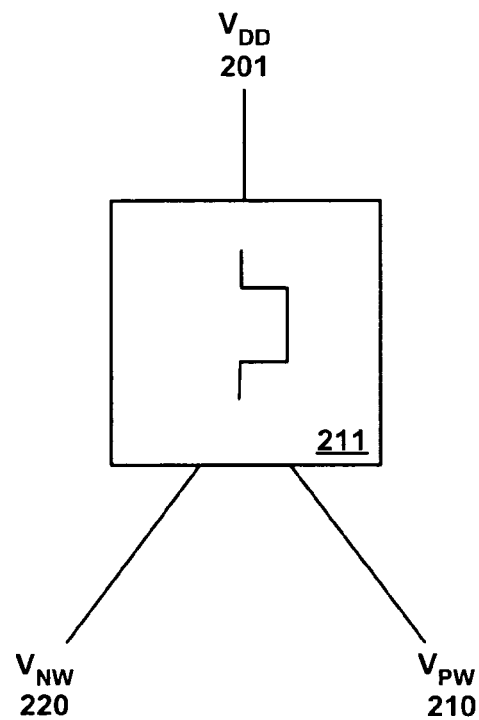
FIG. 2 is a schematic representation of a body bias domain, in accordance with embodiments of the present invention.

FIG. 2 is a schematic representation of a body bias domain 200, in accordance with embodiments of the present invention. By way of example, body bias domain 200 can represent body bias domain 103 of FIG. 1. Block 211 represents all of the circuit elements of body bias domain 200. For example, block 211 corresponds to n-type field effect transistor 105 and p-type field effect transistor 106, as well as the coupling and isolation structures of FIG. 1. In accordance with an embodiment of the present invention, block 211 can comprise a delay locked loop circuit. Vdd 201 is the operating voltage for devices within body bias domain 200.

Vnw 220 is the body biasing voltage applied to body terminals of p-type devices within body bias domain 200. Vnw corresponds to Vnw1 120 of FIG. 1. Vpw 210 is the body biasing voltage applied to body terminals of n-type devices within body bias domain 200. Vpw corresponds to Vpw1 110 of FIG. 1. It is appreciated that a body bias domain can comprise a single body biasing coupling. In such case the schematic symbol can indicate a single indication of body biasing voltage, e.g., either Vnw 220 or Vpw 210.

Figure 5:
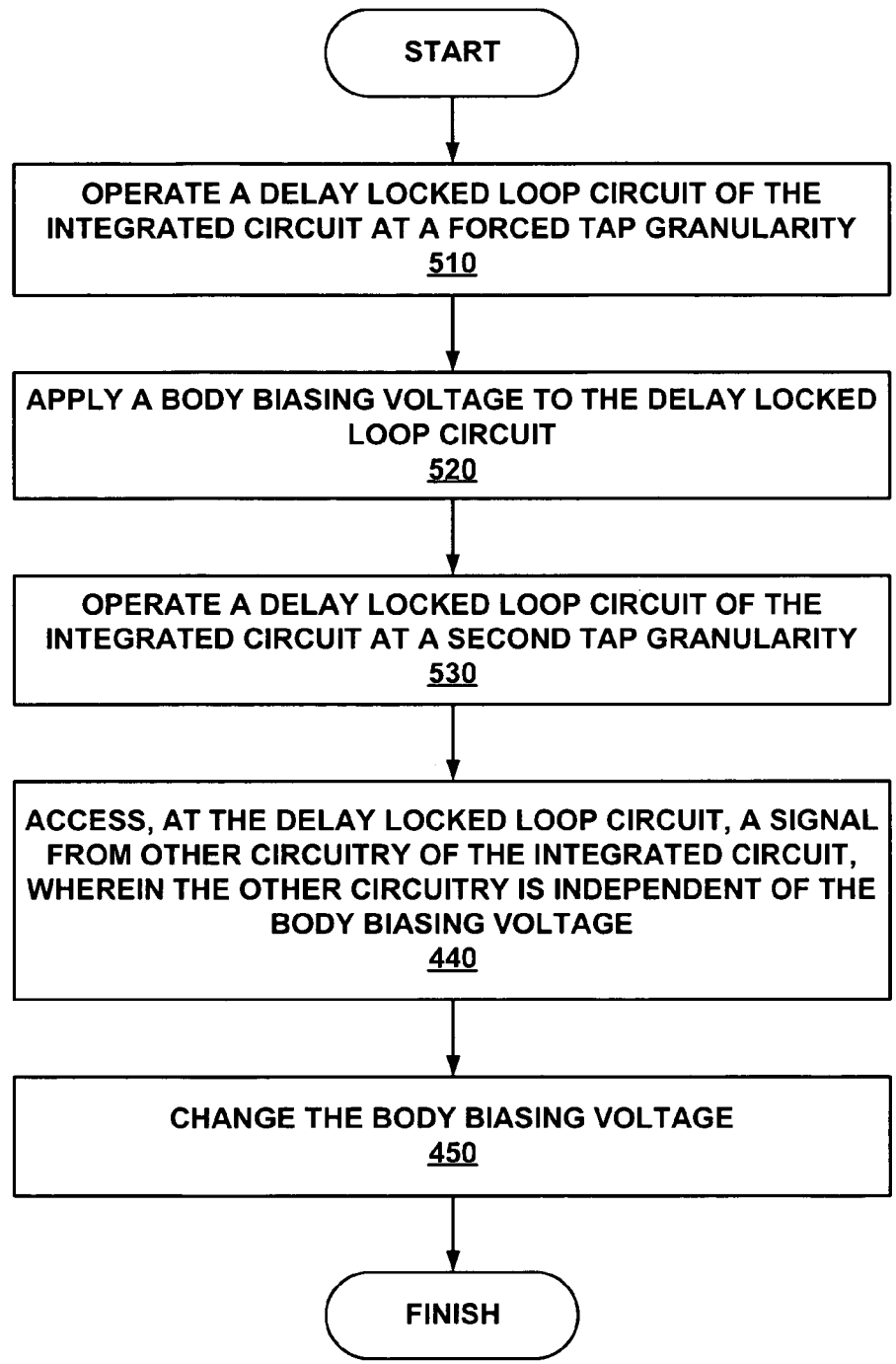
FIG. 5 illustrates a flowchart of another method of operating an integrated circuit, in accordance with embodiments of the present invention.

FIG. 5 illustrates a flowchart of a method 500 of operating an integrated circuit, in accordance with embodiments of the present invention. In block 510, a delay locked loop circuit of the integrated circuit is operated at a first tap granularity.

In block 520, a body biasing voltage is applied to the delay locked loop circuit. In block 530, the delay locked loop circuit of the integrated circuit is operated at a second tap granularity.

In optional block 440, a signal from other circuit of the integrated circuit is accessed at the delay locked loop circuit. The other circuit is independent of the body biasing voltage. In optional block 450, the body biasing voltage is changed.

In this novel manner, operational characteristics of a delay locked loop circuit are modified, e.g., to change a capture frequency and/or to change tap granularity, according to an applied body biasing voltage. It is appreciated that such changes are effected without layout changes to the circuitry.

Independent Circuit Adjustment

Figure 3:
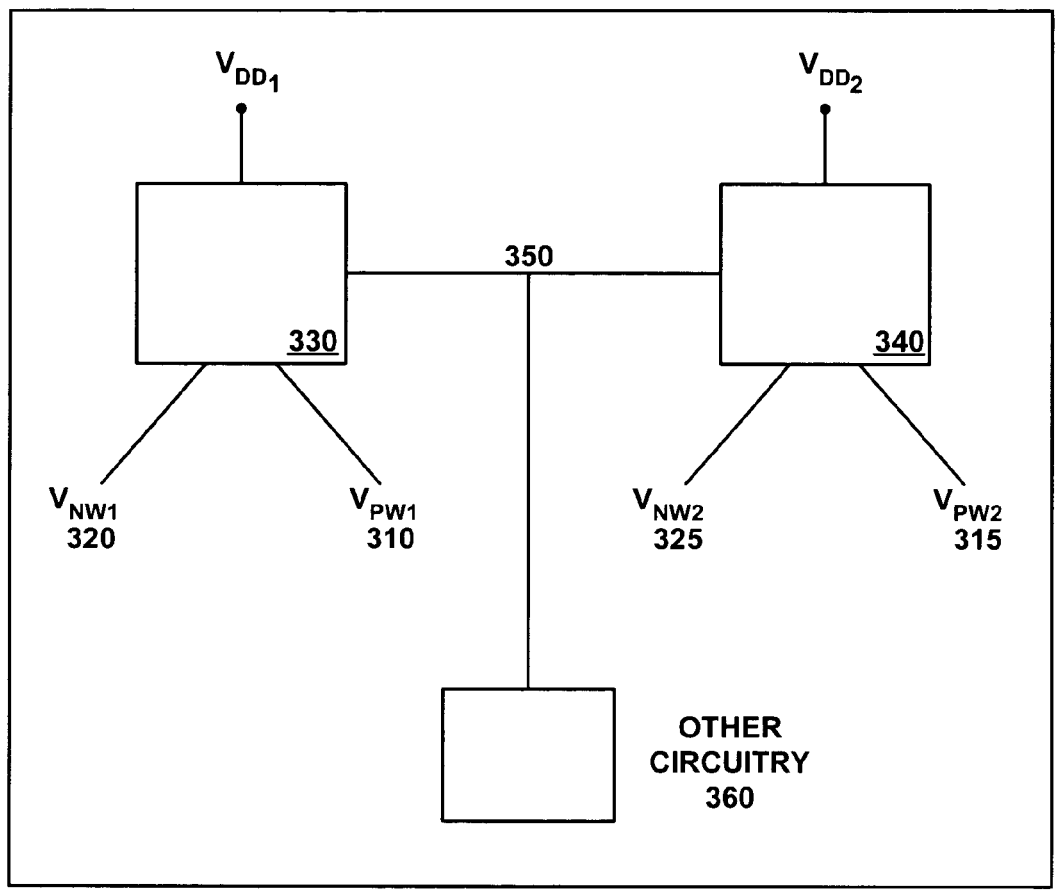
FIG. 3 is a block diagram of an integrated circuit, in accordance with embodiments of the present invention.

FIG. 3 is a block diagram of a novel integrated circuit, in accordance with embodiments of the present invention. Integrated circuit 300 comprises body bias domain 330 and body bias domain 340. It is to be appreciated that circuitry of body bias domain 330 and circuitry of body bias domain 340 can, although they are not required to, operate from different operating voltages, e.g., Vdd1 and Vdd2.

As described previously, body bias domain 330 comprises circuitry that is capable of accessing applied body bias voltages Vnw1 320 and Vpw1 310. Similarly, body bias domain 340 comprises circuitry that is capable of accessing applied body bias voltages Vnw2 325 and Vpw2 315. Integrated circuit 300 further comprises other circuitry 360 that is not a part of body bias domain 330 and not a part of body bias domain 340. Other circuitry 360 may or may not be a part of, or comprise, a separate body bias domain. Circuitry of body bias domain 330 is functionally coupled (350) to circuitry of body bias domain 340 and/or other circuitry 360.

Operational characteristics, e.g., threshold voltage, operating frequency and/or gate delays of the circuitry within body bias domain 330 can be adjusted by adjusting an applied body biasing voltage, e.g., body biasing voltage Vnw1 320 and/or body biasing voltage Vpw1 310. It is to be appreciated that such adjustments to body biasing voltage Vnw1 320 and/or body biasing voltage Vpw1 310, and consequent adjustments to operational characteristics of the circuitry within body bias domain 330, do not change operational characteristics of other circuitry of integrated circuit 300, e.g., the circuitry of body bias domain 340 or other circuitry 360. For example, the circuitry of body bias domain 330 can be adjusted to operate faster than nominal, while the circuitry of body bias domain 340 and/or other circuitry 360 maintain nominal operation.

By the novel creation of a plurality of independent body bias domains, numerous advantages can be realized. As previously discussed, for example, body bias domain 330 can comprise a delay locked loop or major functional units of a microprocessor, e.g., a floating point unit or a video controller. Other circuitry of integrated circuit 300, e.g., circuitry of body bias domain 340 and/or other circuitry 360 can access a signal generated within body bias domain 330. If, for example, finer granularity between delay taps of the delay locked loop is needed, body biasing voltage(s) to body bias domain 330 can be adjusted to achieve such finer granularity between delay taps. It is appreciated that no design or layout changes need be made to the exemplary delay locked loop within body bias domain 330 to achieve such a change.

In a similar manner, relative timing of circuitry in bias domain 330 and bias domain 340 can be adjusted by adjusting corresponding body biasing voltages. For example, if circuitry within a body bias domain does not meet required timing, such circuitry can be "sped up," or made to operate faster by adjusting body biasing voltages for a body bias domain comprising the circuitry. Such a capability of changing operating characteristics after manufacture of an integrated circuit can beneficially increase yield of usable integrated circuit devices. It is appreciated that other circuitry in other body bias domains can be operated at different, e.g., nominal, operating characteristics.

Because semiconductor device characteristics can vary within an individual die (or chip), for example large microprocessors, multiple independent body bias domains can be utilized to compensate for such intra-die process variations. Additionally, body biasing voltages can be utilized to compensate for more global process variations.

Figure 6:
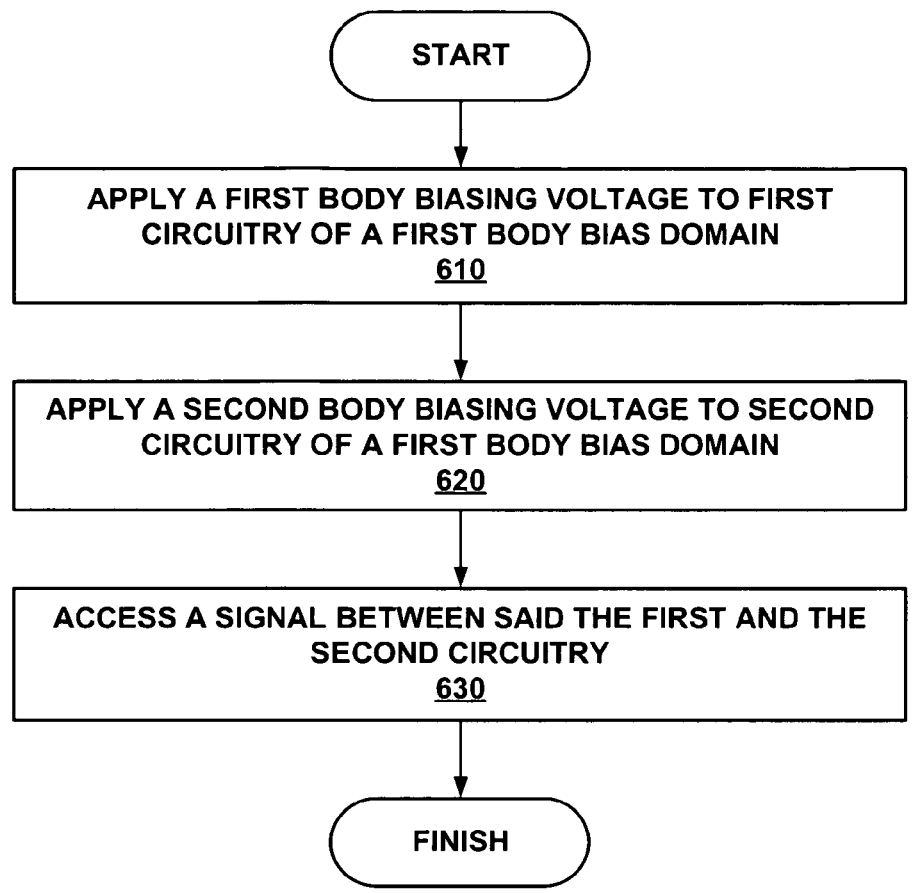
FIG. 6 illustrates a flowchart of still another method of operating an integrated circuit, in accordance with embodiments of the present invention.

FIG. 6 illustrates a flowchart of a method 600 of operating an integrated circuit, in accordance with embodiments of the present invention. In block 610, a first body biasing voltage is applied to first circuitry of a first body bias domain.

In block 620, a second body biasing voltage is applied to second circuitry of a second body bias domain. In block 630, a signal between the first and the second circuitry is accessed.

In accordance with embodiments of the present invention, either the first or the second body biasing voltages described above can be zero. For example, circuitry in one of the body bias domains can be operated with no applied body biasing voltage.

However, applying a body biasing voltage, e.g., a first body biasing voltage applied to first circuitry of a first body bias domain, can cause the first circuitry to switch faster than the first circuitry would switch without application of the first body biasing voltage. Such a change in switching speed can be sufficient to change the first circuitry from non-functional (due to timing) to functional.

For example, if the first circuitry was designed to function under nominal manufacturing process conditions, a particular instance of the integrated circuit may not function due to process variations. Applying a body biasing voltage to the first circuitry can modify its operation such that it becomes functional under the biasing conditions.

Alternatively, the first circuitry could be designed not to function under nominal manufacturing process conditions. For example, the manufacturing process conditions could be "tuned" to skew the manufacturing distribution toward lower power, slower parts. Such skewing can be acceptable for many circuits on the integrated circuit, for example. However, there can be some circuits that are "designed" not to work at projected process conditions. The behavior of such circuits can be adjusted after manufacture by the application of body biasing voltage(s) such that the circuits function under biased operational conditions.

It is appreciated that locating such circuitry in an independent body bias domain of the integrated circuit enables such adjustments without undesired adjustment of the other, working, circuitry of the integrated circuit.

Embodiments in accordance with the present invention provide for adjusting threshold voltages of transistors within multiple independent body bias domains of an integrated circuit, for example in highly integrated semiconductors, e.g., microprocessors. Adjusting threshold voltages, for example, can beneficially adjust circuit timings, including relative timings, reduce power consumption and heat generation of such integrated circuits and/or to eliminate process variation effects on threshold voltage.

Embodiments in accordance with the present invention, systems and methods for integrated circuits comprising multiple body bias domains, are thus described. While the present invention has been described in particular embodiments, it should be appreciated that the present invention should not be construed as limited by such embodiments, but rather construed according to the below claims.

What is claimed is
1. A method of operating an integrated circuit comprising:
   operating a delay locked loop circuit of said integrated circuit at a first tap granularity;
   applying a body biasing voltage to said delay locked loop circuit; and
   operating said delay locked loop circuit at a second tap granularity in response to said body biasing voltage.
2. A method according to claim 1 wherein said second tap granularity is less than said first tap granularity.
3. A method according to claim 1 further comprising accessing, at said delay locked loop circuit, a signal from other circuitry of said integrated circuit, wherein said other circuitry is independent of said body biasing voltage.

4. A method according to claim 1 wherein said integrated circuit comprises a microprocessor.

5. A method according to claim 3 wherein said delay locked loop circuit and said other circuitry operate at the same operating voltage.

6. A method according to claim 1 further comprising changing said body bias voltage.

7. An integrated circuit comprising a delay locked loop circuit disposed for receiving a body biasing voltage, wherein said body biasing voltage is operable to modify a tap granularity of said delay locked loop circuit.

8. An integrated circuit according to claim 7 wherein said body biasing voltage is separate from other circuitry of said integrated circuitry.

9. An integrated circuit according to claim 7 wherein an applied body bias voltage is operable to decrease a tap granularity of said delay locked loop circuit.

10. An integrated circuit according to claim 7 wherein said delay locked loop circuit is disposed to accept a plurality of body biasing voltage values to produce a plurality of tap granularities of said delay locked loop circuit.

* * * * *